United States Patent
Suzuki

(10) Patent No.: US 7,030,027 B1
(45) Date of Patent: Apr. 18, 2006

(54) ETCHING METHODS AND APPARATUS FOR PRODUCING SEMICONDUCTOR DEVICES

(75) Inventor: Koji Suzuki, Chiba (JP)

(73) Assignee: Kawasaki Microelectronics, Inc., Chiba (JP)

( * ) Notice: Subject to any disclaimer, the term of this patent is extended or adjusted under 35 U.S.C. 154(b) by 674 days.

(21) Appl. No.: 09/714,971

(22) Filed: Nov. 20, 2000

(30) Foreign Application Priority Data

Nov. 26, 1999 (JP) .................................. 11-336268

(51) Int. Cl.
*H01L 21/20* (2006.01)

(52) U.S. Cl. ...................... 438/710; 438/711; 438/709; 438/714; 438/734

(58) Field of Classification Search ................ 438/710, 438/711
See application file for complete search history.

(56) References Cited

U.S. PATENT DOCUMENTS

| | | | |
|---|---|---|---|
| 5,160,407 A | 11/1992 | Latchford et al. | |
| 5,326,727 A | 7/1994 | Kook et al. | |
| 5,471,094 A * | 11/1995 | Lien | 257/774 |
| 5,665,203 A | 9/1997 | Nelson | |
| 5,965,461 A | 10/1999 | Yang et al. | |
| 5,972,796 A | 10/1999 | Yang et al. | |
| 5,994,234 A | 11/1999 | Ouchi | |
| 6,025,273 A * | 2/2000 | Chen et al. | 438/706 |
| 6,037,265 A | 3/2000 | Mui et al. | |
| 6,069,091 A * | 5/2000 | Chang et al. | 438/719 |
| 6,083,815 A | 7/2000 | Tsai et al. | |
| 6,103,631 A | 8/2000 | Soda et al. | |
| 6,103,632 A | 8/2000 | Kumar et al. | |
| 6,136,211 A | 10/2000 | Qian et al. | |
| 6,350,696 B1 * | 2/2002 | Shields et al. | 438/704 |

OTHER PUBLICATIONS

Process Data Example for Hitachi M308 Microwave Plasma Etcher.

* cited by examiner

*Primary Examiner*—Robert Kunemund
(74) *Attorney, Agent, or Firm*—Oliff & Berridge PLC

(57) ABSTRACT

A multi-layered film on a semiconductor substrate is etched with a multi-step etching process by sequentially providing a plurality of process gases having different compositions in a chamber. A plasma discharge to excite the process gases is continued without an interruption during a switch to a different process gas. A relationship between different process gases desirable for the continuous plasma excitation is also disclosed. An apparatus suitable to practice this continuous plasma excitation process includes a process gas supply system having a gas reservoir. A mixture of at least two component gases is prepared and reserved in the reservoir, and is supplied to the etching chamber when it is needed.

34 Claims, 7 Drawing Sheets

ETCHING METHODS AND APPARATUS FOR PRODUCING SEMICONDUCTOR DEVICES

BACKGROUND OF THE INVENTION

1. Field of Invention

This invention relates to methods and apparatus for making semiconductor devices. In particular, this invention relates to etching processes and etching apparatus.

2. Description of the Related Art

In etching processes for producing semiconductor devices, a film formed on a surface of a semiconductor substrate (wafer) is etched through a mask pattern formed on the film by a chemical reaction. Etching processes are classified into dry processes and wet processes. In dry processes, a process gas introduced into an etching chamber is excited by a plasma generated by an electric discharge, and a surface of a masked semiconductor substrate is exposed to the plasma to etch the film on the substrate. The process gas provided in the etching chamber is a gaseous mixture, which is formulated depending on the material of the film to be etched.

In a conventional process, for example, a process gas is introduced into an etching chamber by supplying a plurality of component gases into the chamber with controlled flow rates. A semiconductor wafer having a film to be etched and a mask pattern on the film is placed on a stage, to which a bias voltage is applied, and is irradiated with radicals and ions formed by plasma excitation of the process gas. The film is etched through the mask to form a desired pattern.

When the film to be etched has a multi-layered structure, appropriate etching parameters, such as pressure and composition of the process gas (i.e., kinds of component gases included in the process gas and/or ratios between the component gases), must be set for each of the layers. The plasma excitation of the process gas for the first layer is interrupted before changing the process gas in the chamber, and is resumed after a period necessary to stabilize the process gas for the second layer.

An example etching process is a process for etching a multi-layered structure of BARC (bottom antireflective coating)/WSi (tungsten silicide)/poly-Si layers formed on a $SiO_2$/Si substrate. Such structure is typically etched to form a gate electrode of a MOS transistor. Typically, an $O_2$-$Cl_2$-Ar-based process gas is used for etching the organic BARC layer and an $O_2$-$Cl_2$-based process gas is used for etching the WSi layer. Further, a two-step etching process, including a main etch using an $O_2$-HBr-$Cl_2$-based process gas to etch a substantial thickness of the poly-Si layer, and an overetch using an $O_2$-HBr-based process gas to clear residues remaining on the surface of the underlying $SiO_2$ layer is employed.

When the step is changed from the BARC etching to the WSi etching, a total gas flow rate significantly changes due to termination of the Ar gas flow, and a total gas pressure in the chamber may become unstable. The plasma discharge is interrupted to prevent uncontrolled etching during this unstable period. When the step is changed from the WSi etching step to the poly-Si etching step, HBr gas is introduced into the process gas. The total pressure and the ratio between component gases in the process gas may become unstable due to an abrupt increase of HBr gas flow rate. The plasma discharge is interrupted until the process gas condition is stabilized. When the step is changed from the poly-Si etching to the overetching, the total gas pressure may become unstable because the total pressure of the overetching process gas is significantly higher than that of the main etching process gas. The plasma discharge is also interrupted to prevent uncontrolled etching of the underlying $SiO_2$ layer.

The downtime for the temporary interruption of the plasma discharge significantly decreases the production efficiency. The downtime is approximately 15 seconds to 20 seconds for each change. For example, in a standard 0.35-µm process, the total downtime becomes approximately 45 seconds to 60 seconds due to these three interruption periods. This downtime occupies approximately one-third of the total etching time (approximately 180 seconds) for etching, for example, BARC/WSi/poly-Si=110/100/150 nm structure.

A hard mask of a $SiO_2$ or SiN layer may also be used to form a gate electrode. In this case, a composite structure of BARC/$SiO_2$ or SiN layer/WSi layer/poly-Si layer should be etched. The etching reaction of the $SiO_2$ or SiN layer is significantly different from the etching reaction of the overlying BARC layer and that of the underlying WSi layer, and requires different etching species. Therefore, a process gas with a different chemistry, i.e., a process gas including a different main etchant gas, is need. More specifically, different from above described process gases for etching BARC or WSi layers including a chlorine-containing gas and an oxygen-containing gas as main etchant gases, a process gas including a fluorine-containing gas as a main etchant gas, for example, a $CF_4$-Ar-based gas composition, a $SF_6$-$CF_4$-Ar-based gas composition, or a mixture of $CHF_3$ gas with one of the $CF_4$-Ar-based gas compositions is used.

To switch between such different process gases with different gas chemistries, a fairly long time is needed, and the plasma discharge must be interrupted for every change from one layer to the subsequent layer.

The interruption and subsequent resumption of the plasma discharge may also degrade the production yield. Particles generated during repeated processing in the etching chamber accumulate on the inner wall of the chamber. These particles are released from the chamber well and re-enter into the processing space when the process gas is introduced or when the plasma discharge is interrupted or resumed. The re-entered particles are electrically charged and float in the plasma, and may adhere to the surface of the semiconductor substrate when the discharge is interrupted. The particles adhered to the surface of the semiconductor substrate function as a mask for the subsequent etching step, resulting in patterning defects and decreased yield. Such defects will become a significant problem in the production of advanced semiconductor devices with reduced critical dimensions.

SUMMARY OF THE INVENTION

It is an object of this invention to provide methods and apparatus for producing semiconductor devices with an increased production efficiency. Another object of this invention is to provide methods and apparatus for producing semiconductor devices with a decreased defect density.

The inventor has unexpectedly discovered that, despite the prior belief that the plasma should be interrupted between different steps, a multi-step etching can be made with a continuous plasma excitation of a plurality of process gases having different compositions. The uninterrupted processes according to this invention significantly reduce downtime due to the interruptions of the plasma discharge. Further, semiconductor devices with a low defect density can be produced by preventing the adhesion of particles to the semiconductor substrate. A proper design of the process gases, or a proper control of the process gas supply sequence, is desirable to achieve the continuous plasma excitation process. Etching processes using the properly designed process gases are advantageous even when the plasma discharge is interrupted, because the interruption period can be minimized. Apparatus according to this invention can advantageously control the process gas supply sequence.

According to an aspect of this invention, exemplary embodiments of methods of fabricating semiconductor devices comprise: placing a semiconductor substrate in an etching chamber, the substrate having an upper layer over a surface of the substrate and a lower layer under the upper layer; providing a first process gas and then a second process gas into the chamber, the first process gas and the second process gas having different compositions from each other; generating a plasma in the chamber to excite the first process gas and then the second process gas, the generating continues without an interruption between the excitations of the first and second process gases; and etching at least a portion of the upper layer using the excited first process gas and then at least a portion of the lower layer using the excited second process gas.

According to another aspect of this invention, exemplary embodiments of methods of fabricating semiconductor devices comprise: placing a semiconductor substrate in an etching chamber, the substrate having a stack of a mask layer, a material layer and an underlying layer over a surface of the semiconductor substrate; providing a first process gas and then a second process gas in the chamber, the first process gas and the second process gas having different compositions from each other; generating a plasma in the chamber to excite the first process gas and then the second process gas, the generating continues without an interruption between the excitations of the first and the second process gases; and etching a substantial thickness of an unmasked portion of the material layer using the excited first process gas and then etching residues of the unmasked portion of the material layer using the excited second process gas until the underlying layer is exposed in the unmasked portion.

According to another aspect of this invention, exemplary embodiments of methods of treating a plurality of semiconductor substrates comprise: receiving the plurality of semiconductor substrates, each of the semiconductor substrates having at least one material layer over a surface of the substrate; reserving a mixture of at least two component gases in a gas reservoir by supplying at least two component gases to the gas reservoir; introducing at lest one of the received semiconductor substrates into a process chamber; and treating the at least one of the semiconductor substrates introduced into the chamber. The treating includes providing a first process gas and then a second process gas into the chamber, the first and the second process gases having different compositions from each other; generating a plasma in the chamber to excite the first process gas and then the second process gas; and etching the material layer of the introduced substrate using the excited first process gas and then the excited second process gas. The methods further comprise repeating the introducing and treating until all the received semiconductor substrates are treated. The providing includes supplying the reserved gas mixture from the gas reservoir to the chamber and the reserving reserves the gas mixture in an amount sufficient to treat all the received semiconductor substrates.

According to another aspect of this invention, exemplary embodiments of methods of fabricating semiconductor devices comprise placing a semiconductor substrate in an process chamber, the substrate having a silicide layer over a surface of the semiconductor substrate and a silicon layer under the silicide layer; providing a first process gas including a chlorine-containing gas, a bromine-containing gas and an oxygen-containing gas into the chamber, and then providing a second process gas including the chlorine-containing gas, the bromine-containing gas and the oxygen-containing gas mixed with a ratio different from that of the first process gas into the chamber; generating a plasma in the chamber to excite the first process gas and then the second process gas; and etching at least a portion of the silicide layer using the excited first process gas, and then etching at least a portion of the silicon layer using the excited second process gas.

According to another aspect of this invention, exemplary embodiments of methods of fabricating semiconductor devices comprise: placing a semiconductor substrate in a process chamber, the substrate having a BARC layer over a surface of the substrate and a conductive layer of at least one of silicon and silicide under the BARC layer; providing a first process gas including a chlorine-containing gas, a bromine-containing gas and an oxygen-containing gas, and then providing a second process gas including the chlorine-containing gas, the bromine-containing gas and the oxygen-containing gas mixed with a second mixing ratio different from the mixing ratio of the first process gas into the chamber; generating a plasma in the chamber to excite the first process gas and then the second process gas; and etching at least a portion of the BARC layer using the excited first process gas and then etching at least a portion of the conductive layer using the excited second process gas.

According to another aspect of this invention, exemplary embodiments of methods of fabricating semiconductor devices comprise: placing a semiconductor substrate having a silicide layer over a surface of the substrate in a process chamber; providing a process gas including a chlorine-containing gas, a bromine-containing gas and an oxygen-containing gas into the chamber, a ratio of the bromine-containing gas to the chlorine-containing gas is not larger than 0.2; generating a plasma in the chamber to excite the process gas; and etching at least a portion of the silicide layer using the excited process gas.

According to another aspect of this invention, exemplary embodiments of apparatus for fabricating semiconductor devices comprise: a process chamber in which a semiconductor substrate is treated; and a gas supply system that provides at least two process gases into the chamber so that the substrate is successively treated using the at least two process gases, the at least two process gases having different compositions from each other. The gas supply system includes a gas reservoir to reserve a mixture of at least two first component gases included in a first one of the at least two process gases, at least two first mass-flow controllers to supply the at least two first component gases to the gas reservoir, and a second mass-flow controller to supply the reserved gas mixture to the chamber.

According to another aspect of this invention, exemplary embodiments of apparatus for treating a plurality of semiconductor substrates comprise: a loader station that receives the plurality of semiconductor substrates to be treated; a process chamber; a transfer system to introduce at least one of the received semiconductor substrates into the chamber; a gas supply system that provides at least two process gases into the chamber so that the at least one of the semiconductor substrates introduced into the chamber is successively treated using the at least two process gases; and a controller to control operations of the chamber, the transfer system and the gas supply system, so that all the received semiconductor substrates are treated by repeating the introduction of the at least one of the received semiconductor substrates into the chamber and the treatment of the at least one of the received semiconductor substrates. The gas supply system includes a gas reservoir to reserve a mixture of at least two first component gases included in a first one of the at least two process gases and to supply the reserved gas mixture to the chamber, the gas reservoir reserves the gas mixture in an amount sufficient to treat all the received semiconductor substrates, and at least two first mass-flow controllers to supply the at least two first component gases to the gas reservoir.

DETAILED DESCRIPTION OF PREFERRED EMBODIMENTS

The invention was first described in Japanese Patent Application No. 11-336268, hereby incorporated by reference in its entirety.

In a preferred embodiment, a multi-layered film is etched by a multi-step etching process using a plurality of process gases having different compositions. The different process gases are used to etch different layers and also used to etch a certain layer with multiple steps. In the preferred embodiment, the plurality of process gases is continuously excited by a plasma discharge without an interruption throughout the entire etching steps. The etching method of this invention is most advantageously practiced with such completely continuous plasma excitation. This invention is not limited, however, to this mode. Embodiments of this invention generally enable etching with continuous plasma excitation through two or more steps.

The inventor also developed new process gases suitable to practice the etching with the continuous plasma excitation. The developed process gas, or the combination of the designed process gas with another process gas, permits rapid switch of the process gas atmosphere in the etching chamber when the etching process proceeds to the next step. The rapid switch of the atmosphere prevents undesirable effects in the continuous plasma excitation process that might occur if the switch requires a longer period of time. The rapid switch is preferable to shorten the total processing time even when the plasma excitation is interrupted during the switch.

The inventor further devised an apparatus suitable to practice the continuous plasma excitation process. The gas supply system included in the apparatus has a gas reservoir to reserve a mixture of at least two gases included in a process gas used in one step of the etching. The reserved gas mixture can be supplied to the chamber when it is needed. Such supply sequence of the process gas enables rapid switching of the process gas even when the gas chemistry of a process gas used in a step is significantly different from that used in the preceding step. The rapid switch is preferable to shorten the total processing time even when the plasma excitation is interrupted during the switch.

Before explaining the etching method according to the invention, an apparatus for fabricating semiconductor devices according to the invention will be described with reference to preferred embodiments shown in the attached drawings.

Figure 1:
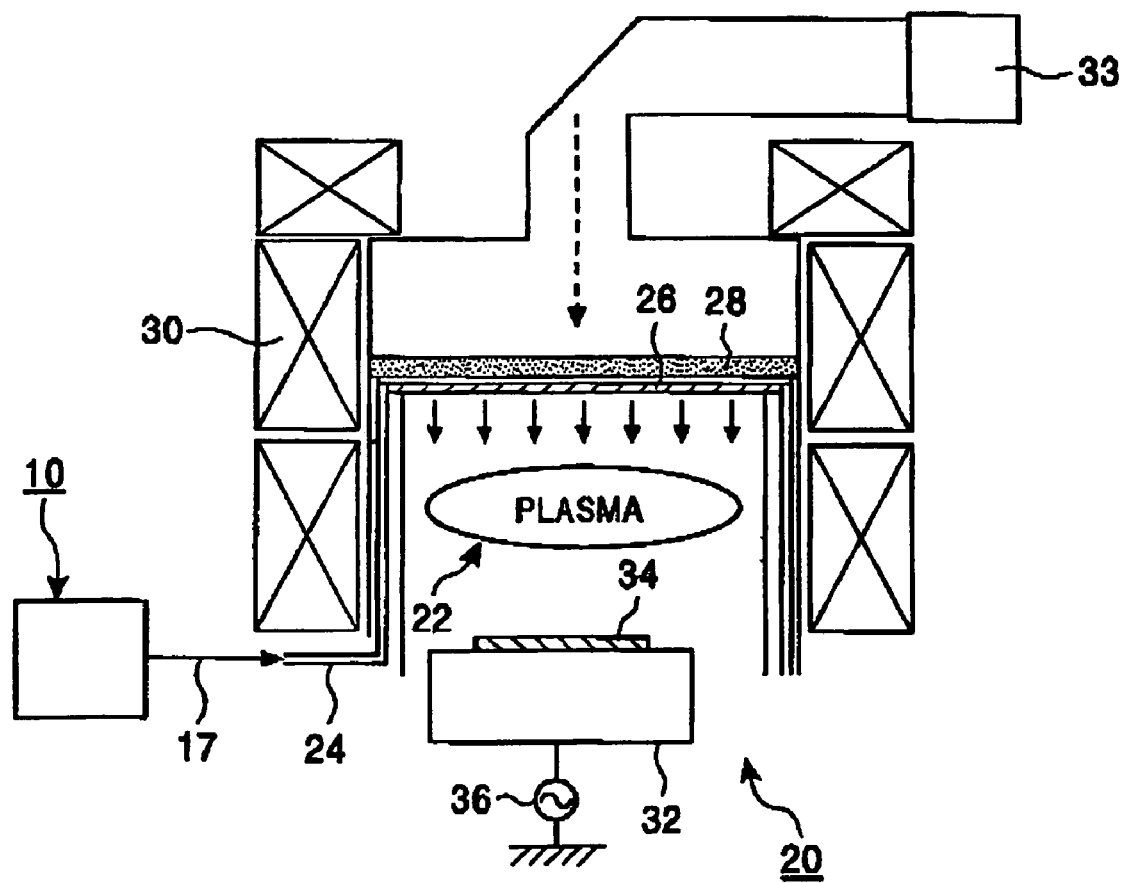
FIG. 1 is a cross-sectional view of an etching chamber and surrounding component used in an embodiment of this invention.
Figure 2:
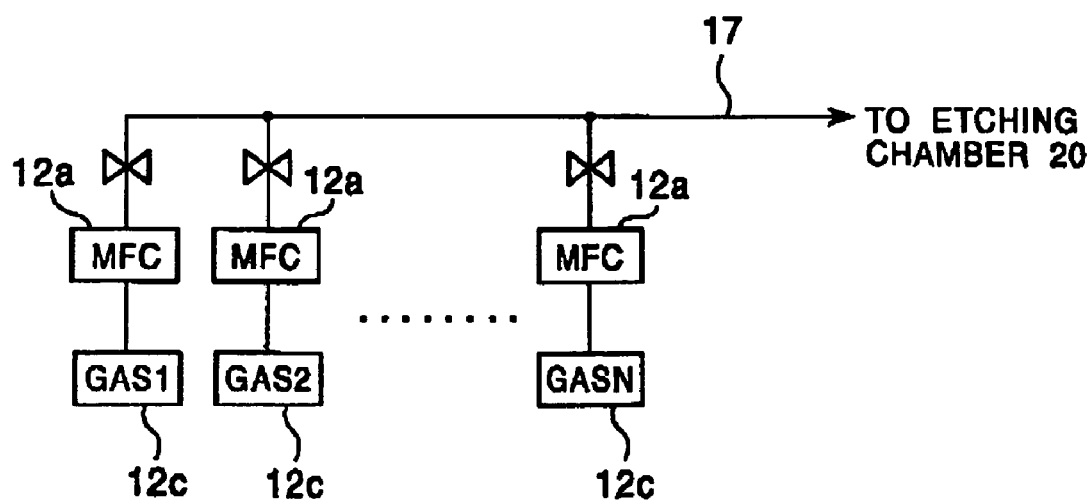
FIG. 2 is a schematic view of a first embodiment of a process gas supply system used in an apparatus of this invention.
Figure 3:
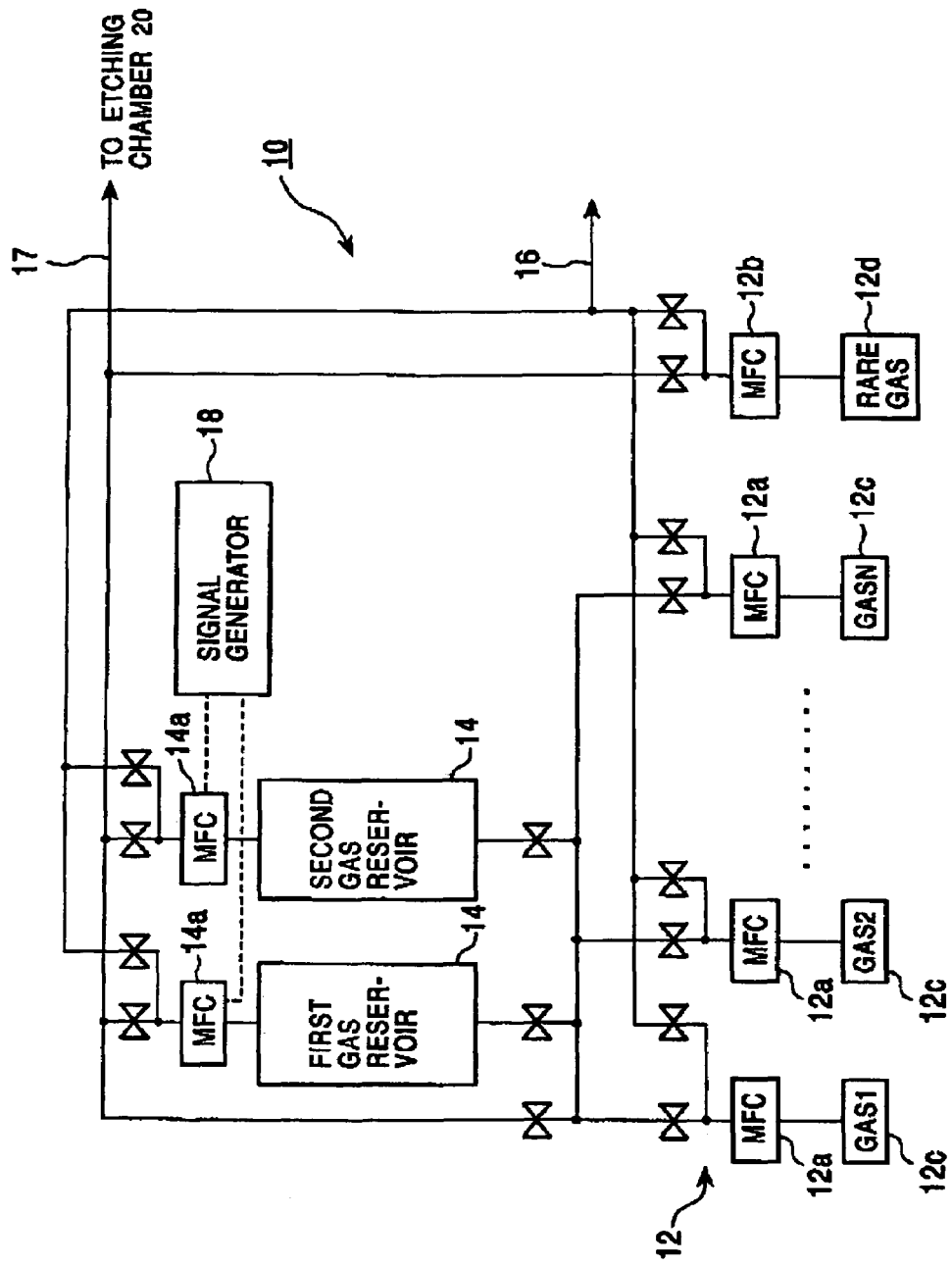
FIG. 3 is a schematic view of a second embodiment of a process gas supply system used in an apparatus of this invention.
Figure 4:
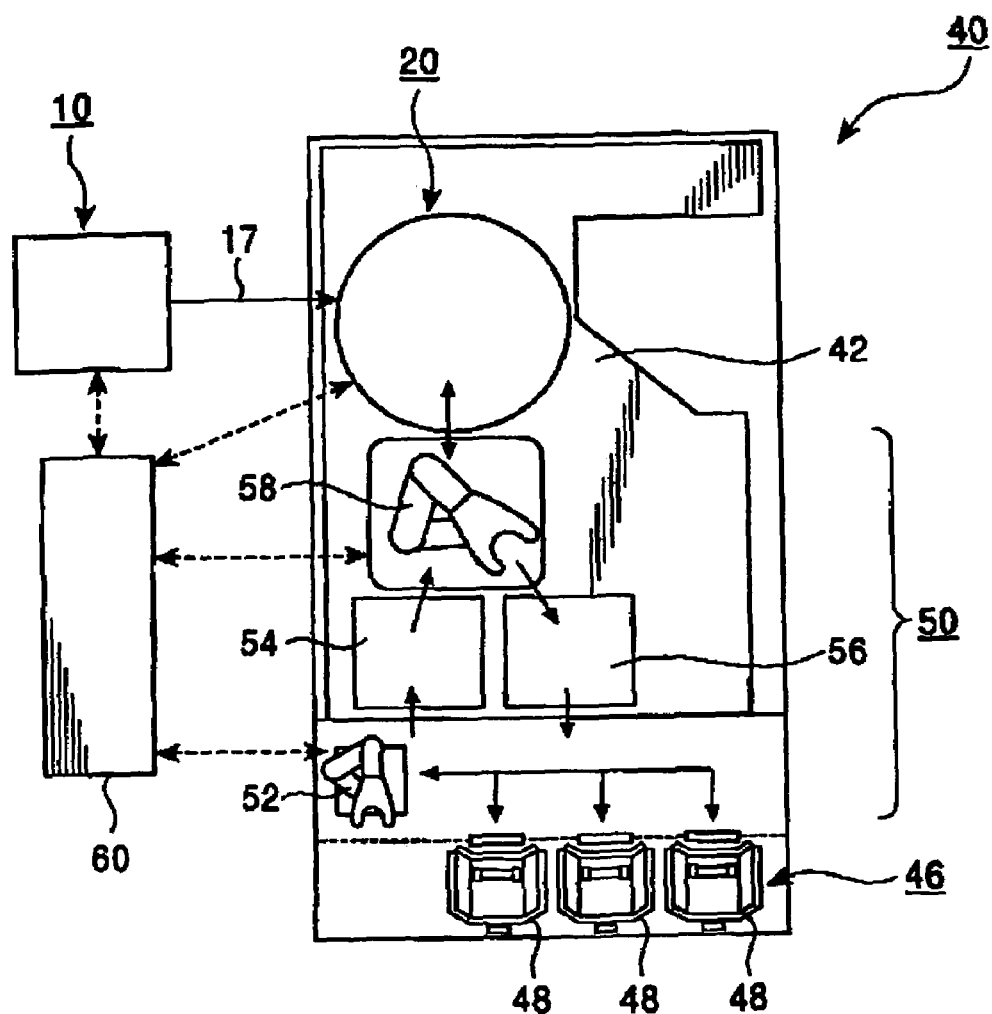
FIG. 4 is a schematic view of an overall construction of an apparatus according to this invention.

FIG. 1 shows a cross-sectional view of a portion of an etching apparatus including an etching chamber 20 and surrounding components suitable to treat an semiconductor substrate according to this invention. FIGS. 2 and 3 show schematic views of first and second embodiments of a process gas supply system used in an apparatus according to this invention. FIG. 4 shows a schematic view of an overall construction of an apparatus according to this invention.

The etching chamber 20 shown in FIG. 1 is an ECR (electron cyclotron resonance) plasma etching chamber provided with a lower electrode 32 for supporting a semiconductor substrate 34. A process gas supplied from a process gas supply system 10 is introduced through a gas introduction port 24 and provided into the chamber 20 through a shower nozzle 26. The process gas is evacuated by an evacuation system including a high-throughput turbo molecular pump (not shown) and a motorized variable conductance valve (not shown) which controls the gas pressure within the chamber 20. Microwave power generated by a microwave power supply 33 is introduced into the chamber 20 through a quartz plate 28 and a high-density plasma is generated at a plasma generation zone 22 within the chamber 20 by interaction of the microwaves with a magnetic field generated by coils 30. The plasma excites the process gas in the chamber and radicals and ions generated by the plasma excitation are irradiated on the surface of the substrate 34 so that the surface of the substrate 34 is treated. Radio frequency power generated by an RF power supply 36 is supplied to the lower electrode 32 to apply a bias voltage to the substrate 34 so that an energy of the ions irradiated on the surface of the substrate 34 is controlled.

The process gas supply system shown in FIG. 2 has a plurality of component gas supply lines 12c (GAS 1 to GAS N). Selected ones of the component gases are supplied with flow rates controlled by respective mass-flow controllers (MFCs) 12a, mixed in a process gas supply line 17 to form a process gas mixture. The process gas mixture is then supplied to the etching chamber 20 through the process gas supply line 17. Each component gas supply line 12c may include a gas cylinder, a regulator, and the like. In this process gas supply system, a single component gas may be supplied in some embodiments, or a mixture of several component gases may be supplied in other embodiments. A mixed gas may also be supplied from one or more of the component gas supply lines 12c.

The process gas supply system 10 shown in FIG. 3 has a mixed gas supply line 12 including a plurality of component gas supply lines 12c (GAS 1 to GAS N) each provided with a MFC 12a. The mixed gas supply line 12 mixes component gases supplied from the component gas supply lines 12c in an appropriate ratio by controlling flow rates of the component gases using the MFCs 12a. The mixed gas can be supplied to the etching chamber through a process gas supply line 17.

The process gas supply system 10 shown in FIG. 3 comprises first and second gas reservoirs 14. The gas reservoirs 14 contain gas mixtures prepared by the mixed gas supply line 12. Thereafter, the gas mixture can be supplied from the gas reservoirs 14 to the chamber 20 through the process gas supply line 17 with a flow rate controlled by the MFC 14a. Moreover, the process gas supply system 10 includes a signal generator 18, which generates signals for setting flow rates corresponding to the conversion factor of the gas mixture in each gas reservoir 14 and supplies the signals to the relevant MFC 14a.

Both the mixed gas supply line 12 and the gas reservoirs 14 are also connected to a gas exhaust line 16. The process gas supply system 10 shown in FIG. 3 also includes a rare gas supply line 12d connected to the gas exhaust line 16 and the process gas supply line 17 via a MFC 12b.

The apparatus 40 shown in FIG. 4 includes an etching chamber 20, such as shown in FIG. 1. The apparatus also includes a substrate loader station 46, a substrate transfer system 50 including an outer robot 52, input and output load locks 54 and 56, and an inner robot 58 located in a buffer room 42. The apparatus 40 also includes a process gas supply system 10, such as shown in FIGS. 2 and 3, and a process gas supply line 17 for supplying the process gas to the process chamber 20. The apparatus 40 further includes a controller 60 that controls operations of the etching chamber 20, process gas supply system 10 and substrate transfer system 50. The operation of the apparatus 40 is explained in detail below.

Methods for fabricating semiconductor devices according to this invention will now be described in detail with reference to preferred embodiments shown in the attached drawings.

When the chemistries of process gases used in a plurality of etching steps are similar to each other, an effective method is as follows. A first process gas composed of a plurality of component gases is used in one of the etching steps, and a second process gas used in the subsequent etching step is composed of the same component gases as in the first process gas, or is composed of less than all of the component gases of the first process gas.

In other words, the first process gas used in the continuous etching of the uppermost layer in the multi-layered film comprises all of the component gases contained in any of the succeeding process gases. When the subsequent layers below the uppermost layer are etched, all the component gases of the first process gas are used, or the flow of one or more of the component gases is stopped. However, no component gas is newly introduced to make the succeeding process gases.

Figure 5:
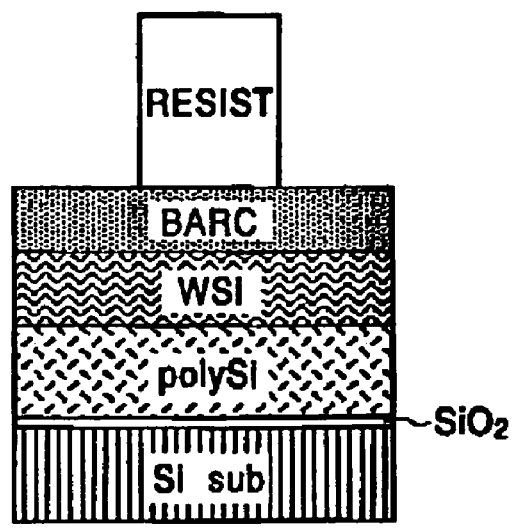
FIG. 5 is cross-sectional view of a semiconductor substrate having a multi-layered film to be etched in a first embodiment.
Figure 6:
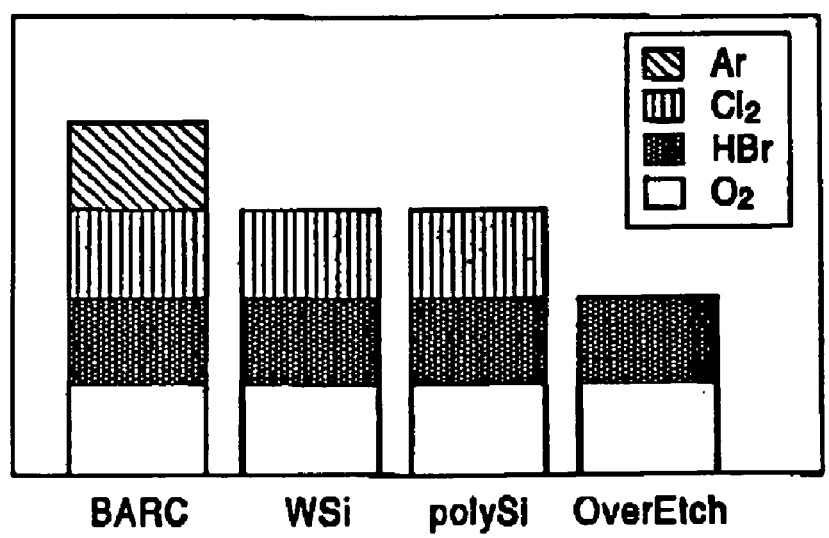
FIG. 6 is a graph showing component gases included in process gases used for etching individual layers in the structure of FIG. 5 according to a first embodiment of this invention.

For example, as illustrated in FIG. 5, when the multi-layered film is composed of BARC/WSi/poly-Si layers on a $SiO_2$/Si-substrate, the multi-layered film can be etched using process gases schematically shown in FIG. 6. That is, the first process gas used in etching the BARC layer is composed of $O_2$, HBr, $Cl_2$ and Ar. The second process gas used in etching the WSi layer is composed of $O_2$, HBr and $Cl_2$. That is, three of the four component gases included in the first process gas are used as component gases of the second process gas and Ar is excluded. Similarly, all or some of component gases in a process gas of a preceding step are(is) used as component gases(gas) in a process gas of a succeeding step. The same relationship is preferably kept over the entire etching process.

In FIG. 6, component gases included in process gases for individual etching steps are shown. The vertical axis of FIG. 6 does not represent flow rates of the component gases. This is also the case in FIGS. 7 and 9 that are described below. The actual flow rates of respective component gases are described below. As shown in FIG. 5, the multi-layered film is etched using a resist mask layer. That is, unmasked portions of the film are selectively etched. The process gases shown in FIG. 6 provide a substantially vertical sidewall of the etched multi-layered film and are suitable to fabricate semiconductor devices with a feature size of about a quarter micron or less.

The process gas is supplied from, for example, a process gas supply system shown in FIG. 2. When the etching process proceeds to the next step, the flow of one or more of the component gases may be stopped and the flow rates of the other component gases may be varied. The pressure in the chamber 20 and the electric power supplied to generate the plasma and/or substrate bias may also be changed. The pressure can be changed in a short period of time by a combination of a high throughput evacuation system including a turbo molecular pump and a motorized variable conductance valve, and the electric power can be rapidly changed by remote control of a power supply.

Figure 7:
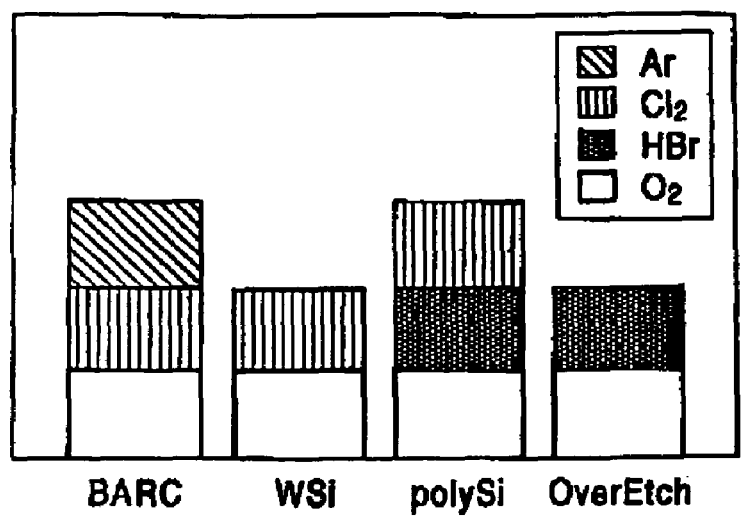
FIG. 7 is a graph showing component gases included in process gases used for etching individual layers in the structure of FIG. 5 by a conventional method.

In a conventional etching process using process gases such as shown in FIG. 7, the BARC layer is etched with a process gas composed of $O_2$, $Cl_2$ and Ar; the WSi layer is etched with a process gas composed of $O_2$ and $Cl_2$; $Cl_2$ and the poly Si layer is etched with a process gas composed of $O_2$, HBr and $Cl_2$. In this conventional process, HBr gas begins to flow when the process changes from the WSi etching step to the poly Si etching step. In this instance, a control signal applied to the MFC of HBr gas changes abruptly from a value indicating zero flow rate to a certain level indicating a flow rate required for the WSi etching. A MFC cannot maintain a constant gas flow rate upon such an abrupt change of the control signal. As a result, the flow rate of HBr gas and the total pressure in the chamber fluctuates. Therefore, the plasma excitation should be interrupted until the process gas atmosphere in the chamber stabilizes.

In the process of the embodiment using process gases shown in FIG. 6, on the other hand, the process gas of the first etching step contains all the component gases contained in any of the succeeding process gases. Thus, no component gas is newly introduced in the succeeding process gases. Specifically, the process gas for the WSi etching contains all the component gases, i.e., $O_2$, HBr and $Cl_2$, contained in the process gas for the poly Si etching. Therefore, instability of the process gas atmosphere in the chamber is suppressed and it is possible to continuously excite the process gas during the change from the WSi etching step to the poly Si etching step. Furthermore, the WSi etching process gas including $O_2$, HBr and $Cl_2$ has been newly developed by the inventor in order to enable the continuous plasma excitation.

When the process changes from the poly Si main etching step to the overetching step, supply of $Cl_2$ is terminated and a flow rate of HBr is varied. The relationship between the poly Si main etching process gas and the overetching process gas of this embodiment is the same as that of the conventional process. In the production of semiconductor devices, the poly Si etching is often utilized to make gate electrodes on an extremely thin gate dielectric layer. The overetching process gas does not include $Cl_2$, because inclusion of $Cl_2$ facilitates erosion of underlying $SiO_2$ or other dielectric layers. Even though the supply of $Cl_2$ is terminated when the main etching is completed, there is a possibility that the partial pressure of $Cl_2$ in the chamber stays relatively high during a certain period, especially because the total pressure in the overetching step is significantly higher than that in the main etching step. The underlying dielectric layer may be undesirably eroded if the etching continues in an atmosphere with such a high $Cl_2$ partial pressure. Prior to this invention, it was a common understanding in the industry that a sufficiently long switching period to completely evacuate the main etching process gas and to supply and stabilize the overetching process gas in the chamber, during which the plasma excitation is interrupted, should be provided between the main etching and the overetching steps in order to prevent undesirable erosion of the underlying dielectric layer.

The importance of complete elimination of $Cl_2$ in the overetching process gas is described in, for example, U.S. Pat. No. 5,665,203.

Despite this prior understanding, the inventor unexpectedly discovered that the etching process can proceed from the poly Si main etching step to the overetching step continuously without an interruption of the plasma excitation. It was confirmed that there is no significant erosion of the underlying layer even with an underlying $SiO_2$ layer as thin as 5 mm.

Even in the conventional process using process gases shown in FIG. 7, the BARC etching process gas includes all the component gases included in the succeeding WSi etching gas. However, even if these process gases include the same component gases, ratios between the component gases are substantially different because BARC and WSi are materially distinct. Prior to this invention, it was also a common understanding in the industry that the plasma excitation should be interrupted and a sufficiently long switching period should be provided between the BARC etching step and the WSi etching step. Despite this prior understanding, the inventor unexpectedly discovered that the etching process can proceed from the BARC etching step to the WSi etching step continuously without an interruption of the plasma excitation. No undesirable effect due to the continuous process was observed.

Although the control signal applied to the Ar MFC changes from a value indicating the flow rate in the BARC etching process gas to a value indicating zero flow rate, the MFC simply closes the valve and maintains a stable operation. Thereby, a continuous plasma excitation without an interruption during the change from the BARC etching step to the WSi etching step is made possible.

Flow rates of component gases in one process gas are not always the same as those in the preceding process gas. When a flow rate of a component gas in one etching step is abruptly changed from the flow rate in the preceding etching gas, a transient change in the pressure in the etching chamber may be significant, resulting an instability of the pressure. In such case, the flow rates may be changed stepwise or gradually to suppress the instability.

Also, in the case of stopping the supply of one or more gas components, the flow rates may be decreased stepwise or gradually until the gas supply is completely stopped. In a preferable stepwise or gradual change in the gas flow rate, a controller of an etching apparatus automatically generates signals for setting the flow rates, which signals vary stepwise or gradually, and supplies the signals to respective MFCs. In this preferable mode, an operator sets only the gas components and the flow rates thereof in respective etching steps, and the controller automatically generates the stepwise or gradually varying signals between two etching steps. This mode frees the operator from the preparation of complicated recipes. The recipes may also include parameters for determining whether or not the flow rates are automatically changed stepwise or gradually between the steps.

During the switch of the process gas, a gas having a small etching effect, such as a rare gas, may be temporally supplied to purge the process gas used in the preceding step. When the process gas contains a rare gas such as Ar or He, the flow rate of the rare gas may be increased during the switching operation. This operation prevents abnormal etching during the transient period. Alternatively, the flow rate of the gases which may cause abnormal etching under increased pressure in the etching chamber may be temporally decreased during the switching operation. In addition, output of the power supply for the plasma discharge may be temporally suppressed during the transient period within a range not causing adhesion of particles on the semiconductor substrate. These temporary changes are preferably achieved by supplying signals automatically generated by the controller to the power supply.

In this embodiment, the BARC/WSi/poly Si multi-layered film is etched with a completely continuous process, i.e., the process gases for different layers are continuously excited without an interruption of the plasma throughout the entire layers, which should be etched in accordance with the same mask pattern. Alternatively, only selected layers may be etched with a continuous plasma discharge.

When the chemistry of one process gas is significantly different from that of the preceding etching gas, the process gas should be supplied with an appropriate sequence. That is, the process gas is preliminarily prepared and reserved in a gas reservoir, and the reserved process gas is supplied from the gas reservoir to the chamber when the etching process proceeds to the step that used the reserved process gas.

In this case, an apparatus having a gas supply system including one or more gas reservoirs such as shown in FIG. 3 is used. Before or during the preceding etching step, a gas mixture is preliminarily prepared by mixing at least two gas components included in the process gas of the subsequent etching step. When the process proceeds to the subsequent etching step, the gas mixture is supplied to the etching chamber through a MFC for the reservoir of the gas mixture.

Figure 8:
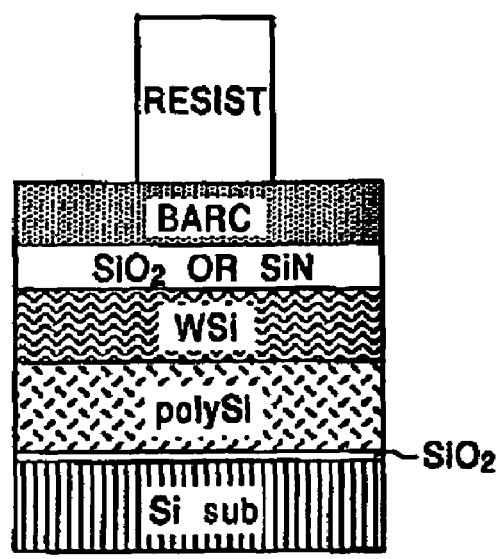
FIG. 8 is a cross-sectional view of a semiconductor substrate having a multi-layered film to be etched in a second embodiment.

An exemplary etching process of a gate structure including BARC/$SiO_2$ or a SiN/WSi multi-layered structure on a $SiO_2$/Si-substrate, as shown in FIG. 8, will be described.

Figure 9:
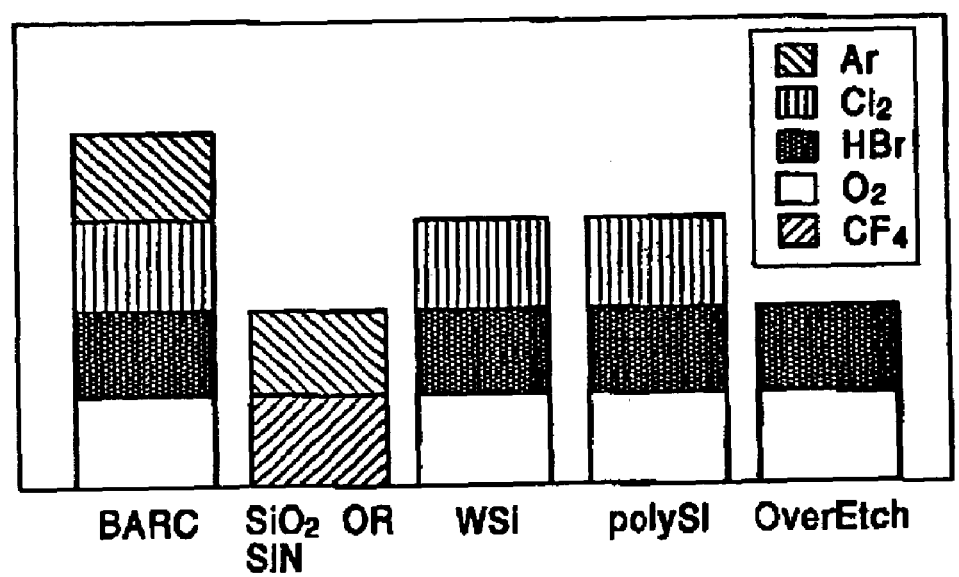
FIG. 9 is a graph showing component gases included in process gases used for etching individual layers in the structure of FIG. 8 according to a second embodiment of this invention.

An exemplary combination of process gases used in this process is shown in FIG. 9. As shown in FIG. 9, a process gas composed of $O_2$, HBr, $Cl_2$ and Ar is used to etch the BARC layer. The primary etching species for the BARC etching is produced from $O_2$. On the contrary, another process gas composed of $CF_4$ and Ar is used to etch the $SiO_2$ or SiN layer. The primary etching species for the $SiO_2$ or SiN etching is produced from $CF_4$. Still another process gas composed of $O_2$, HBr and $Cl_2$ is used to etch the WSi layer. The primary etching species for the WSi etching is produced from $Cl_2$. That is, the chemistry of the $SiO_2$ or SiN etching process gas is significantly different from those of the BARC and WSi etching process gases.

A gas mixture used for etching in an etching step is prepared by mixing required gas components, which are supplied from the relevant component gas supply lines 12c while the flow rates of the component gases are controlled by the MFCs 12a, and is reserved in one of the first and second gas reservoirs 14 before the layer is etched. When the etching process proceeds to the next step, this gas mixture is supplied from the gas reservoir 14 whereas another gas mixture is stored in the other gas reservoir 14. A smooth switching between the steps is thereby achieved, and enables a continuous plasma discharge without an interruption.

A signal generator 18 which generates a control signal for setting the flow rate of the gas mixture using the conversion factor of the gas mixture in the gas reservoir 14 and supplies the signal to the relevant MFC 14a. The signal generator 18 calculates the conversion factor of the gas mixture calculated from the conversion factors of the component gases included in the mixture and the mixing ratio thereof, and generates the control signal necessary to supply the gas mixture with a desired flow rate, and supplies the generated control signal to the MFC 14a. The flow rate of the gas mixture from the gas reservoir 14 is, thereby, controlled by the MFC 14a to the desired value. Although not shown in FIG. 3, signals indicating ratios of individual component gases in the gas mixture, conversion factors of the individual component gases, and flow rates of individual component gases, or a total flow rate of the gas mixture, are input to the signal generator 18 in order to enable the signal generator to generate the control signal.

MFCs are preliminarily calibrated so as to control flow rates of respective component gases. The MFC to supply the gas mixture reserved in the gas reservoir 14, however, cannot be preliminarily calibrated because the composition of the gas mixture differs depending on the material of the layer to be etched. If a signal indicating a desired flow rate of the gas mixture is directly supplied to the MFC 14a for supplying the gas mixture to the chamber, the flow rate cannot be controlled to the desired value.

Because the gases used are not ideal gases, the calculated conversion factor may include an error. This error, however, results in an error in the total flow rate, but not in an error in the mixing ratio between component gases, because the mixing ratio between the component gases is exactly controlled by the MFCs 12a. Etching characteristics significantly depend on the ratio between the component gases in the process gas, but less significantly on the total flow rate. Although a change in the total flow rate affects the etching rate, the change does not affect the shape of the etched pattern. Automatic end point detection can compensate the change in the etching rate.

All the component gases controlling the process gas may be mixed in the gas reservoir 14. Alternatively, part of the component gases may be mixed in the gas reservoir 14, and the remaining components may be directly supplied to the etching chamber 20 via the corresponding MFCs 12a. It is preferable that gases having ratios that significantly affect etching characteristics be preliminarily mixed.

To keep the pressure in the chamber to an appropriate level to maintain the plasma, a process gas of the succeeding step is introduced before the process gas used in the preceding step is evacuated. Even though the chemistry of the succeeding process gas is significantly different from that of the preceding process gas, such a process does not cause any problem at least in the etching of the multi-layers film having the structure shown in FIG. 8.

When a sufficient amount of time is provided for each etching step, the two gas reservoirs 14 may be alternately used for the mixing and supplying. If the time of the etching step is too short to prepare the gas mixture, more than two gas reservoirs 14 with MFCs 14a are provided.

In a specific combination in the layered configuration, incompatibility of process gas chemistries in two successive steps is too large and supplying the process gas of the succeeding step to the chamber without removing the process gas of the preceding step from the chamber may result in an unstable operation. In such case, a purge process is employed by supplying an inactive gas such as a rare gas from the rare gas supply line 12d via an MFC 12b while maintaining the plasma discharge in the chamber. Argon or helium is preferably used for this purpose.

Such a purge process need not to be continued until the process gas of the preceding step is completely purged. Because a purge process of 5 seconds or less is sufficiently effective, the purge process does not significantly increase the total process time. Other parameters, such as the bias voltage applied to the substrate and the source power for generating the plasma during the purge operation, may be optimized, if desired.

In the above-described embodiments, the gas reservoir 14 is used. This invention is, however, not limited to these embodiments. As shown in FIG. 3, each component gas supply line 12c is connected to the exhaust gas line 16 and to the etching chamber 20 via a corresponding one of the MFCs 12a. Using the connection to the exhaust gas line 16, a flow of one or more component gases included in a process gas through the MFC 12a to the exhaust gas line 16 can be formed, while conducting the preceding step in the chamber. The flow rate to the exhaust gas line 16 can be controlled by the MFC 12a to the value required to form the process gas. When the process proceeds to the step requiring the process gas, the flow to the exhaust gas line 16 can be switched to the chamber 20.

Because the gas flow has been stabilized before introduction in the chamber 20, the atmosphere in the chamber can be stabilized within a short period of time after the flow is switched to the chamber. Even when the gas reservoir 14 is used, the flow of the gas mixture from the gas reservoir 14 may be directed to the exhaust gas line 16, and then switch to the etching chamber 20 after the MFC 14a is stabilized.

Such stabilization of flow rate may be performed only for a component gas which was not used in the preceding etching step and is newly introduced in the subsequent etching step. Alternatively, a flow of a mixture of a plurality of component gases included in the process gas to the exhaust gas lines may be formed. For example, if a ratio of a plurality of component gases significantly affects the etching characteristics, a flow of a mixture of these component gases may be formed and then switched to the etching chamber after the ratio becomes stable. To form a flow of a component gas used in the preceding etching step, that component gas line must be provided with two MFCs to the exhaust gas line 16 and to the etching chamber 20.

Methods in which the process gas chemistries are similar to each other and methods in which the process gas chemistries are significantly different may be used in combination. For example, when the process gases shown in FIG. 9 are used, gas mixtures reserved in the gas reservoirs are used in the switching operation from the BARC etching step to the $SiO_2$ or SiN etching step, and from the $SiO_2$ or SiN etching step to the WSi etching step. The switching from the WSi etching step to the poly Si main etching step, and from the poly Si main etching step to the overetching step, can be made without using the gas reservoir.

In production of semiconductor devices, a group of semiconductor substrates (wafers) including, for example, twenty-five substrates, is handled as a unit, or a lot. In the etching apparatus of the invention, a plurality of semiconductor substrates grouped in a lot may be received at a time. On the other hand, the etching chamber 20 shown in FIG. 1 receives and treats one wafer at a time. Therefore, a cycle of transferring one of the wafers in the lot into the chamber, treating the transferred wafer in the chamber, and removing the treated wafer from the chamber is repeated until all the wafers included in the lot are treated. Then the treated lot wafers are sent to the next processing apparatus in the production line. It is also possible to use an etching chamber that can treat more than one wafer at a time. In such embodiments, the cycle should be repeated if the number of wafers that can be treated simultaneously in the chamber is less than the number of wafers in the lot.

For example, the apparatus shown in FIG. 4 has a substrate loader station 46 that can accept a plurality of substrates contained in three cassettes 48. Each of the cassettes 48 can contain at most twenty-five substrates. The substrates contained in each cassette 48 constitute a lot. Therefore, the substrate loader station 46 of the apparatus 40 shown in FIG. 4 can receive at most three lots of substrates at a time. A selected one of the substrates contained in a selected one of the cassettes 48 received at the substrate loader station 46 is picked by the outer robot 52 and inserted into the input load lock 54, and then picked by the inner robot 58 and transferred into the chamber 20. Appropriate process gases are supplied from the process gas supply system 10 to the chamber 20 through the process gas supply line 17, and the transferred substrate is treated within the chamber using the process gases. After the treatment is completed, the transfer system 50 returns the substrate to the cassette. The same procedure is repeated until all of the received substrates are treated. The controller 60 communicates with the chamber 20, process gas supply system 10, and the substrate transfer system 50 thereby to control and organize the operations of these components. The controller 60 also communicates with a central controller (not shown) that controls operations of the entire production line.

In this case, at least one gas mixture is prepared by mixing at least two component gases with an appropriate ratio and is reserved in a gas reservoir 14, which is connected to the etching chamber through a MFC 14a, when the apparatus 40 receives the semiconductor substrates to be treated at the substrate loader station 46. The reserved gas mixture may be supplied to the etching chamber 20 in each of the treatment cycles. The gas mixture need not be prepared again during the treatment of the wafers in the lot, if the gas reservoir 14 has a sufficient volume to reserve an amount of the gas mixture sufficient to treat all the substrates in the lot.

In this method, the mixing ratio of the gas mixture reserved in the gas reservoir 14 may be adjusted based on a information from a processing step prior to the etching step, for example, a lithography step for forming a mask layer on the multi-layered film to be etched.

When a dimension of the mask formed in the photolithography step is larger than a standard or target mask dimension, the ratio is adjusted so that a reduction in the dimension during the etching is increased and the dimension of the etched pattern reaches the target pattern dimension. The relationship between the mixing ratio and the reduction of the size is experimentally determined and is stored in the controller 60 of the etching apparatus or in the central controller as a database so that the ratio can be determined based on the determined relationship. Such an adjustment of the mixing ratio can compensate for fluctuations in the lithography step and can produce etched patterns with nearly exactly the target pattern dimension. In order to enable the adjustment, the controller 60 of the apparatus receives an electrical signal indicating the target pattern dimension from the central controller via, for example, a network. The controller 60 also receives a signal indicating a deviation of the mask dimension from the target mask dimension, or a combination of the mask dimension and the target mask dimension, either directly from a measurement apparatus used in the lithography process or through the central controller. Using the received information, and based on the database, the controller 60 determines the mixing ratio and generates control signals to be supplied to the MFC 12a. Alternatively, if the database is possessed by the central controller, the central controller may determine the mixing ratio using the information received from the lithography process and send a signal indicating the determined mixing ratio to the controller of the etching apparatus.

The method of adjusting the mixing ratio based on the information from the preceding process step is also applicable to the case in which the process gas is provided by supplying component gases from the individual component gas supply lines 12c without using the gas reservoir 14.

The methods of this invention decrease the total processing time to produce a semiconductor device, and the resulting semiconductor device has a reduced defect density. This method is particularly effective for gate etching process, in which a multi-layered film, such as BARC/poly Si, BARC/WSi/poly Si, BARC/SiO$_2$ or SiN/WSi/poly Si, W/WN/poly Si, and WSi/poly Si structures, on a thin underlying dielectric layer is etched. Off course, however, the methods can be applied to etch various other multi-layered structures including various layers of materials. Although embodiments described above etch multi-layered films including a WSi layer, the method can be applied to etch multi-layered films including various other silicides. Although embodiments described above etch multi-layered films including a poly Si layer, the method can be applied to etch multi-layered films including silicon layers in any crystalline structures. Although embodiments described above etch a multi-layered film including a SiO$_2$ or SiN layer, the method can be applied to etch multi-layered films including various dielectric layers. Further, the method may also be advantageously applied to etch a single layer of various materials such as a Si layer on a underlying dielectric layer, in which the Si film is etched by multiple steps including a main etching step and an overetching step.

In embodiments described above, BARC, WSi and poly Si layers are etched using process gases including Cl$_2$, HBr and O$_2$. Various other chlorine-containing gases such as HCl may be used instead of, or in addition to, Cl$_2$. Various other bromine-containing gases such as Br$_2$, BrCl and IBr may be used instead of, or in addition to, HBr. Also, various other oxygen-containing gases may be used instead of, or in addition to O$_2$. One important feature of this invention is to keep the relationship between process gases that all component gases included in a process gas of a succeeding step are included in the process gas of the preceding step, irrespective of specific component gases included in the process gases.

In embodiments described above, a SiO$_2$ or SiN layer is etched using process gases composed of CF$_4$ and Ar. Various other fluorine-containing gases such as CHF$_3$, and SF$_6$ may be used instead of, or in addition to, CF$_4$. In addition to the component gases shown in FIGS. 3 and 4, a small amount of back side gas such as He can be supplied in the chamber through the back side of the substrate in order to facilitate the thermal contact between the lower electrode 32 and the substrate.

In the embodiment, the multi-layered film is etched using an ECR plasma. The continuous etching process of this invention can be practiced using various other types of plasmas. Plasmas that can operate at low pressure such as ECR, TCP (transformer coupled plasma), and ICP (inductive coupled plasma) are particularly suitable to practice the invention, because the low pressure operation facilitates the quick switch of the process gases in the chamber.

EXAMPLE 1

Semiconductor substrates each having a multi-layered structure of BARC/WSi/poly-Si/SiO$_2$/Si-substrate were prepared and etched in an ECR etching chamber by supplying process gases composed of component gases with flow rates shown in TABLE 1. The process gases are continuously excited by a plasma discharge without an interruption throughout the entire steps of BARC etching, WSi etching, poly-Si main etching, and poly-Si overetching. In TABLE I, a hyphen (-) indicates that the corresponding component gas was not used. Other etching conditions including the total gas pressure, the microwave power, and the RF power are summarized in TABLE 2. The process time required for etching the BARC (110 nm)/WSi (100 nm)/poly-Si (150 nm) layers per substrate are shown in TABLE 3. The etching time for each layer was determined by automatic end-point detection, while the overetching time was fixed to thirty seconds.

Comparative Example 1

Semiconductor substrates were prepared in the same manner as in Example 1 and etched in the same etching chamber while supplying process gases including component gases with flow rates shown in TABLE 1. The plasma discharge was interrupted each time when the etching step was changed. A fifteen seconds switching time was provided to stabilize the process gas in the chamber for each time of changing the step. The process times required for etching the BARC (110 nm)/WSi (100 nm)/poly-Si (150 nm) layers per substrate are shown in TABLE 2.

TABLE 1

| | Component Gas | Step/Flow Rate (sccm) | | | |
| --- | --- | --- | --- | --- | --- |
| | | BARC | WSi | poly-Si | Overetching |
| Example 1 | Cl$_2$ | 20 | 140 | 80 | — |
| | HBr | 20 | 20 | 100 | 150 |
| | O$_2$ | 30 | 20 | 5 | 5 |
| | Ar | 50 | — | — | — |
| Comparative Example 1 | Cl$_2$ | 20 | 80 | 80 | — |
| | HBr | — | — | 100 | 150 |
| | O$_2$ | 20 | 8 | 5 | 5 |
| | Ar | 100 | — | — | — |

TABLE 2

| | | Step/Value | | | |
| --- | --- | --- | --- | --- | --- |
| | Conditions | BARC | WSi | poly-Si | Overetching |
| Example 1 | Pressure (Pa) | 1.0 | 0.4 | 0.4 | 1.2 |
| | Microwave Power (W) | 600 | 400 | 400 | 400 |

TABLE 2-continued

| | | Step/Value | | | |
| --- | --- | --- | --- | --- | --- |
| | Conditions | BARC | WSi | poly-Si | Overetching |
| | RF Power (W) | 20 | 30 | 25 | 25 |
| Comparative Example 1 | Pressure (Pa) | 1.0 | 0.3 | 0.4 | 1.2 |
| | Microwave Power (W) | 600 | 400 | 400 | 400 |
| | RF Power (W) | 15 | 25 | 25 | 25 |

TABLE 3

| | Time (seconds) | |
| --- | --- | --- |
| Step | Example 1 | Comparative Example 1 |
| BARC | 40 | 50 |
| Switching | 0 | 15 |
| WSi | 30 | 35 |
| Switching | 0 | 15 |
| poly-Si | 14 | 15 |
| Switching | 0 | 15 |
| Overetching | 30 | 30 |
| Total | 114 | 175 |

As shown in TABLE 3, the total etching time in Example 1 was decreased by approximately sixty seconds or 34% per wafer. A total processing time for a lot of twenty-five wafers was significantly decreased by approximately twenty-five minutes or a 25% reduction, that is, from 105 minutes in Comparative Example 1 to 80 minutes in Example 1.

The etching conditions for the BARC and WSi layers are different between Example 1 and Comparative Example 1, and the total etching time of Example 1 is further decreased by the effects of these improved etching conditions.

The inventor has developed the WSi etching process gas including O$_2$, HBr and Cl$_2$ in order to enable the continuous plasma excitation. Both of this newly developed WSi etching process gas and the poly-Si etching process gas are composed of the same component gases, i.e., O$_2$, HBr and Cl$_2$. However, these two process gases include these component gases with different ratios, and thus have different compositions. Specifically, the ratio of Cl$_2$ flow rate to HBr flow rate in the WSi etching process gas is higher than that in the poly-Si etching process gas.

The main etching species in this WSi etching process gas is produced from Cl$_2$, as in the case of the conventional process gas composed of Cl$_2$ and O$_2$. Therefore, the ratio of HBr in the process gas should not be excessively high. The ratio (flow rate ratio) of HBr relative to Cl$_2$ should preferably not be higher than one fifth (1/5), or more preferably not higher than one seventh (1/7) to keep the etched sidewall of WSi substantially vertical relative to the surface of the substrate. In fact, in order to keep the MFC of HBr stable during the switch to the poly Si etching step, the HBr flow rate in the WSi etching step may be set to the lowest controllable value. Further, the ratio of Cl$_2$ to O$_2$ should preferably be between about 5.0 to about 13.5, and more preferably between about 7 to about 8, to keep the sidewall of WSi substantially vertical. An excessive amount of HBr and/or an insufficient amount of oxygen facilitates deposition of bromide species such as CBr$_x$ and WBr$_x$ that hinders etching of WSi.

To keep the relationship that all the component gases included in succeeding process gas are included in the preceding process gas, a BARC etch process gas composed of $O_2$, HBr, $Cl_2$ and Ar was developed. BARC etching using this process gas is described in U.S. Pat. No. 6,492,068, hereby incorporated by reference in its entirety. When the process changes from the BARC etching to the WSi etching, supply of Ar gas is terminated and flow rates of $O_2$, HBr and $Cl_2$ are varied. No other component gas is introduced.

The main etching species in this process gas is produced from $O_2$. Although the main etching species are different with each other, the chemistries of the process gases for BARC and WSi etchings are considered to be similar in the sense that either one of the process gases includes the component gas that produce the main etching species in the other one of the process gases.

EXAMPLE 2

Semiconductor device substrates each having a multi-layered structure of BARC/$SiO_2$/WSi/poly-Si on $SiO_2$/Si-substrate are etched in an ECR etching chamber by a completely continuous plasma excitation without an interruption using process gases shown in TABLE 4. Other conditions are summarized in TABLE 5. The conditions in other steps are the same as shown in TABLE 2. Some of the process gases are preliminarily prepared according to the ratios shown in TABLE 4 and reserved in the gas reservoir, and are supplied from the gas reservoir to the etching chamber. In TABLE 4, the hyphen (-) indicates that the corresponding component gas is not used. The process times for etching the BARC (110 nm)/$SiO_2$ (100 nm)/WSi (100 nm)/poly-Si (150 nm) layers per wafer are shown in TABLE 4.

Comparative Example 2

Semiconductor device substrates as in Example 2 and are etched in the etching chamber as in Example 2 using process gases shown in TABLE 4, in which the plasma discharge is interrupted each time when the etching proceeds to a different step. The process times for etching the BARC (110 nm)/$SiO_2$ (100 nm)/WSi (100 nm)/poly-Si (150 nm) layers per wafer are shown in TABLE 6.

TABLE 4

| | Component Gas | Step/Flow Rate (sccm) | | | | |
|---|---|---|---|---|---|---|
| | | BARC | $SiO_2$ | WSi | poly-Si | Overetching |
| Example 2 | $Cl_2$ | 20 | — | 140 | 80 | — |
| | $CF_4$ | — | 70 | — | — | — |
| | HBr | 20 | — | 20 | 100 | 150 |
| | $O_2$ | 30 | — | 20 | 5 | 5 |
| | Ar | 50 | 140 | — | — | — |
| Comparative Example 2 | $Cl_2$ | 20 | — | 80 | 80 | — |
| | $CF_4$ | — | 70 | — | — | — |
| | HBr | — | — | — | 100 | 150 |
| | $O_2$ | 20 | — | 8 | 5 | 5 |
| | Ar | 100 | 140 | — | — | — |

TABLE 5

| | | Step/Value | | | | |
|---|---|---|---|---|---|---|
| | Conditions | BARC | $SiO_2$ | WSi | poly-Si | Overetching |
| Example 2 | Pressure (Pa) | 1.0 | 2.0 | 0.4 | 0.4 | 1.2 |
| | Microwave Power (W) | 600 | 800 | 400 | 400 | 400 |
| | RF Power (W) | 20 | 70 | 30 | 25 | 25 |
| Comparative Example 2 | Pressure (Pa) | 1.0 | 2.0 | 0.3 | 0.4 | 1.2 |
| | Microwave Power (W) | 600 | 800 | 400 | 400 | 400 |
| | RF Power (W) | 15 | 70 | 25 | 25 | 25 |

TABLE 6

| | Time (seconds) | |
|---|---|---|
| Step | Example 2 | Comparative Example 2 |
| BARC | 40 | 50 |
| Switching | 0 | 15 |
| $SiO_2$ | 60 | 55 |
| Switching | 0 | 15 |
| WSi | 26 | 35 |
| Switching | 0 | 15 |
| poly-Si | 14 | 15 |
| Switching | 0 | 15 |
| Overetching | 30 | 30 |
| Total | 170 | 245 |

Table 6 shows that a decrease in total etching time by the continuous plasma excitation in this invention is more significant as the number of the layers in the gate structure increases.

Figure 10:
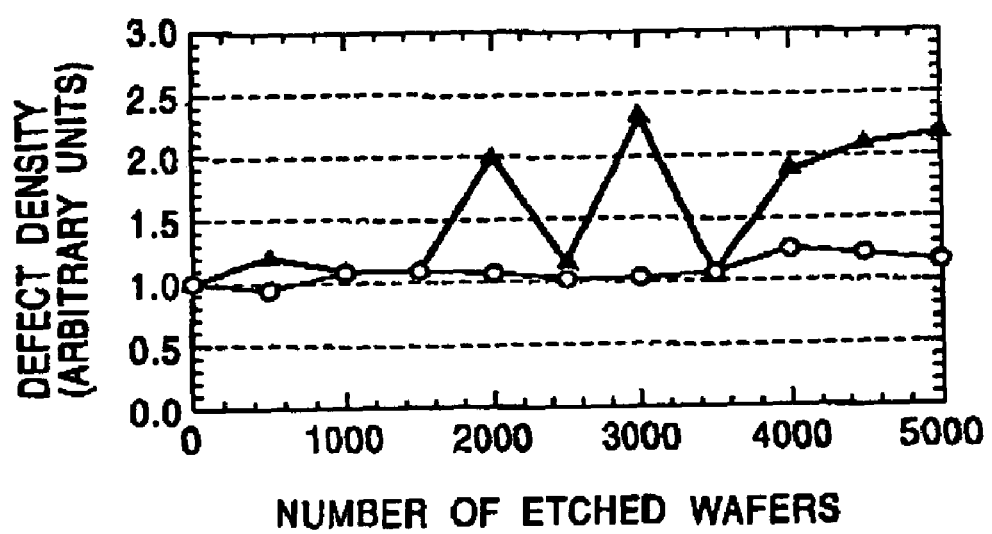
FIG. 10 is a graph showing a relationship between the defect density and number of etched wafers in an embodiment of this invention.

FIG. 10 is a graph showing the relationship between the defect density and the number of the substrate etched in Example 2 (indicated by the symbol ○) and Comparative Example 2 (indicated by the symbol ▲). Substrates having low and stable defect densities are produced for a long period by the continuous plasma excitation process in Example 2, whereas substrates produced by the interrupted plasma excitation process in Comparative Example 2 have high and unstable number of defects.

According to this invention, a continuous plasma exclusion of different process gases is achieved by a proper selection of the process gases, or by a proper sequence of supplying the process gases. Thus, the processing time is significantly shortened, and adhesion of particles on semiconductor substrates is suppressed. Accordingly, semiconductor devices with low defect densities can be produced with a high production efficiency.

What is claimed is:

1. A method of fabricating a semiconductor device, comprising
   placing a semiconductor substrate in an etching chamber, the substrate having an upper layer over a surface of the substrate and a lower layer under the upper layer;

providing a first process gas and then a second process gas into the chamber, the first process gas and the second process gas having different compositions from each other;
generating a plasma in the chamber to excite the first process gas and then the second process gas, the generating continues without an interruption between the excitations of the first and second process gases; and
etching at least a portion of the upper layer using the excited first process gas and then at least a portion of the lower layer using the excited second process gas.

2. The method according to claim 1, wherein the upper layer is a BARC layer and the lower layer is one of a silicide layer and a silicon layer.

3. The method according to claim 1, wherein the upper layer is a silicide layer and the lower layer is a silicon layer.

4. The method according to claim 1, wherein the first process gas is provided by supplying a plurality of component gases to the chamber, and the second process gas is provided by at least one of (i) changing a flow rate of at least one of the component gases, and (ii) terminating the supply of at least one of the component gases of the first process gas.

5. The method according to claim 1, wherein the second process gas is provided into the chamber after purging the first process gas by supplying a purge gas to the chamber.

6. The method according to claim 1, wherein the second process gas includes at least two component gases mixed with a first ratio, and the second process gas is provided by reserving a mixture of the component gases mixed with the first ratio in a gas reservoir during or before the etching of the upper layer and then supplying the reserved gas mixture to the chamber.

7. The method according to claim 1, wherein the substrate further includes a mask layer over the upper layer.

8. A method of fabricating a semiconductor device, comprising:
placing a semiconductor substrate in an etching chamber, the substrate having a stack of a mask layer, a material layer and an underlying layer over a surface of the semiconductor substrate;
providing a first process gas and then a second process gas in the chamber, the first process gas and the second process gas being different in their component gases;
generating a plasma in the chamber to excite the first process gas and then the second process gas, the generating continues without an interruption between the excitations of the first and the second process gases; and
etching a substantial thickness of an unmasked portion of the material layer using the excited first process gas and then etching residues of the unmasked portion of the material layer using the excited second process gas until the underlying layer is exposed in the unmasked portion.

9. A method of treating a plurality of semiconductor substrates, comprising:
receiving the plurality of semiconductor substrates at an apparatus having a gas reservoir and a process chamber, each of the semiconductor substrates having at least one material layer over a surface of the substrate;
reserving a mixture of at least two component gases in the gas reservoir by supplying the at least two component gases to the gas reservoir;
introducing at least one of the received semiconductor substrates into the process chamber;
treating the at least one of the semiconductor substrates introduced into the chamber, the treating including:
providing a first process gas and then a second process gas into the chamber, the first and the second process gases having different compositions from each other; and
generating a plasma in the chamber to excite the first process gas and then the second process gas;
etching the material layer of the introduced substrate using the excited first process gas and then the excited second process gas; and
repeating the introducing and treating until all the received semiconductor substrates are treated,
wherein the providing includes supplying the reserved gas mixture from the gas reservoir to the chamber and the reserving reserves the gas mixture in an amount sufficient to treat all the received semiconductor substrates.

10. The method according to claim 9, wherein the generating continues without an interruption between the excitations of the first and the second process gases.

11. The method according to claim 9, wherein:
each of the semiconductor substrates has a mask layer having a mask dimension over the material layer, the mask dimension deviates from a target mask dimension;
the etching anisotropically etches an unmasked portion of the material layer to form a pattern of the material layer having a pattern dimension, a difference between the pattern dimension and the mask dimension depends on a mixing ratio of the at least two component gases in the gas mixture;
the reserving includes adjusting the mixing ratio of the at least two component gases to compensate for the deviation of the mask dimension from the target mask dimension.

12. A method of fabricating a semiconductor device, comprising:
placing a semiconductor substrate in an process chamber, the substrate having a silicide layer over a surface of the semiconductor substrate and a silicon layer under the silicide layer;
providing a first process gas including a chlorine-containing gas, a bromine-containing gas and an oxygen-containing gas into the chamber, and then providing a second process gas including the chlorine-containing gas, the bromine-containing gas and the oxygen-containing gas of the first process gas mixed with a ratio different from that of the first process gas into the chamber;
generating a plasma in the chamber to excite the first process gas and then the second process gas; and
etching at least a portion of the silicide layer using the excited first process gas, and then etching at least a portion of the silicon layer using the excited second process gas.

13. The method according to claim 12, wherein the generating continues without an interruption between the excitations of the first and the second process gases.

14. The method according to claim 12, wherein the ratio of the chlorine-containing gas to the bromine-containing gas in the second process is lower than the ratio of the chlorine-containing gas to the bromine-containing gas in the first process gas.

15. The method according to claim 12, wherein the chlorine-based gas is $Cl_2$, the bromine-based gas is HBr and the oxygen-based gas is $O_2$.

16. A method of fabricating a semiconductor device, comprising:
- placing a semiconductor substrate in a process chamber, the substrate having a BARC layer over a surface of the substrate and a silicide layer under the BARC layer;
- providing a first process gas including a chlorine-containing gas, a bromine-containing gas and an oxygen-containing gas, and then providing a second process gas including the chlorine-containing gas, the bromine-containing gas and the oxygen-containing gas of the first process gas mixed with a ratio different from that of the first process gas into the chamber;
- generating a plasma in the chamber to excite the first process gas and then the second process gas; and
- etching at least a portion of the BARC layer using the excited first process gas and then etching at least a portion of the silicide layer using the excited second process gas.

17. The method according to claim 16, wherein the generating continues without an interruption between the excitations of the first and the second process gases.

18. The method according to claim 16, wherein the silicide layer is a tungsten silicide layer.

19. The method according to claim 16, wherein the chlorine-containing gas is $Cl_2$, the bromine-containing gas is HBr and the oxygen-containing gas is $O_2$.

20. The method according to claim 16, wherein:
- the substrate further has a silicon layer under the silicide layer;
- the providing further includes, after providing the second process gas, providing a third process gas including a chlorine-containing gas, a bromine-containing gas and the oxygen-containing gas of the first and second process gases mixed with a ratio different from the ratio of the second process gas into the chamber;
- the generating further excites the third process gas; and
- the etching further includes, after the etching of the silicide layer, etching at least a portion of the silicon layer using the excited third process gas.

21. The method according to claim 20, wherein the generating continues without an interruption between the excitations of the second and the third process gases.

22. A method of fabricating a semiconductor device, comprising:
- placing a semiconductor substrate having a silicide layer over a surface of the substrate in a process chamber;
- providing a process gas including a chlorine-containing gas, a bromine-containing gas and an oxygen-containing gas into the chamber, wherein a ratio of the bromine-containing gas to the chlorine-containing gas is not larger than 0.2;
- generating a plasma in the chamber to excite the process gas; and
- etching at least a portion of the silicide layer using the excited process gas.

23. The method according to claim 22, wherein the chlorine-containing gas is $Cl_2$, the bromine-containing gas is HBr and the oxygen-containing gas is $O_2$.

24. The method according to claim 23, wherein a ratio of the chlorine-containing gas to the oxygen-containing gas is from about 5 to about 13.5.

25. The method according to claim 22, wherein the silicide layer is a tungsten silicide layer.

26. The method according to claim 1, wherein the first and the second process gases are different in their component gases.

27. The method according to claim 1, wherein the first and the second layers are different in their materials.

28. The method according to claim 1, wherein the upper layer is a BARC layer and the lower layer is one of a silicon oxide and a silicon nitride layer.

29. The method according to claim 1, wherein the upper layer is one of a silicon oxide and a silicon nitride layer and the lower layer is a silicide layer.

30. The method according to claim 1, wherein the upper layer is a tungsten layer and the lower layer is a tungsten nitride layer.

31. The method according to claim 8, wherein the underlaying layer is a gate dielectric layer.

32. The method according to claim 31, wherein the material layer is a silicon layer.

33. The method according to claim 32, wherein the first process gas includes a chlorine-containing gas, a bromine-containing gas, and an oxygen-containing gas, and the second process gas includes the bromine-containing gas and the oxygen-containing gas.

34. The method according to claim 33, wherein the chlorine-containing gas is $Cl_2$, the bromine-containing gas is HBr, and the oxygen containing gas is $O_2$.

* * * * *